(12) United States Patent
Jeong et al.

(10) Patent No.: US 12,293,088 B2
(45) Date of Patent: May 6, 2025

(54) NONVOLATILE MEMORY DEVICE INCLUDING SELECTIVE BIT LINE AND SOURCE LINE PRECHARGE TIMES AND OPERATING METHOD THEREOF

(71) Applicant: SK hynix Inc., Icheon-si (KR)

(72) Inventors: Chan Hui Jeong, Icheon-si (KR); Dong Hun Kwak, Icheon-si (KR); Se Chun Park, Icheon-si (KR)

(73) Assignee: SK hynix Inc., Icheon-si (KR)

( * ) Notice: Subject to any disclaimer, the term of this patent is extended or adjusted under 35 U.S.C. 154(b) by 210 days.

(21) Appl. No.: 18/073,130

(22) Filed: Dec. 1, 2022

(65) Prior Publication Data
US 2024/0020022 A1   Jan. 18, 2024

(30) Foreign Application Priority Data
Jul. 12, 2022  (KR) ................. 10-2022-0085350

(51) Int. Cl.
*G06F 3/06*   (2006.01)
*G11C 7/10*   (2006.01)
*G11C 7/12*   (2006.01)

(52) U.S. Cl.
CPC .......... *G06F 3/0619* (2013.01); *G06F 3/0629* (2013.01); *G06F 3/0679* (2013.01); *G11C 7/1096* (2013.01); *G11C 7/12* (2013.01)

(58) Field of Classification Search
None
See application file for complete search history.

(56) References Cited

U.S. PATENT DOCUMENTS

| | | | | |
|---|---|---|---|---|
| 2002/0159315 A1 * | 10/2002 | Noguchi | ................ | H10B 69/00 |
| | | | | 257/E27.103 |
| 2015/0003167 A1 * | 1/2015 | Choi | ................ | G11C 16/0483 |
| | | | | 365/185.19 |
| 2017/0062070 A1 * | 3/2017 | Moon | ................ | G11C 16/3495 |
| 2020/0020404 A1 * | 1/2020 | Kim | ................ | G11C 7/14 |
| 2020/0176066 A1 * | 6/2020 | Her | ................ | G06F 11/076 |
| 2020/0388341 A1 * | 12/2020 | Yang | ................ | G11C 16/0483 |
| 2021/0166771 A1 * | 6/2021 | Jung | ................ | G11C 16/10 |
| 2021/0295916 A1 * | 9/2021 | Li | ................ | G11C 16/16 |
| 2023/0015493 A1 * | 1/2023 | Jung | ................ | G11C 16/10 |

FOREIGN PATENT DOCUMENTS

| KR | 1020150001134 A | 1/2015 |
|---|---|---|
| KR | 1020210067677 A | 6/2021 |

* cited by examiner

*Primary Examiner* — J. H. Hur
(74) *Attorney, Agent, or Firm* — William Park & Associates Ltd.

(57) ABSTRACT

A memory device includes a precharge time information storage for storing information on a first precharge time for which a bit line control signal is applied and a second precharge time for which a source line control signal is applied, which are determined according to a degree to which a program operation is performed. The memory device also includes a precharge voltage controller for providing the bit line control signal and the source line control signal respectively to page buffers and a source line driver for a longer precharge time selected from the first precharge time and the second precharge time in the program operation.

10 Claims, 11 Drawing Sheets

NONVOLATILE MEMORY DEVICE INCLUDING SELECTIVE BIT LINE AND SOURCE LINE PRECHARGE TIMES AND OPERATING METHOD THEREOF

CROSS-REFERENCE TO RELATED APPLICATION

The present application claims priority under 35 U.S.C. § 119(a) to Korean patent application number 10-2022-0085350 filed on Jul. 12, 2022, in the Korean Intellectual Property Office, the entire disclosure of which is incorporated by reference herein.

BACKGROUND

1. Technical Field

The present disclosure generally relates to an electronic device, and more particularly, to a memory device and an operating method thereof.

2. Related Art

A semiconductor device is a device for storing data by using characteristics of semiconductors. A semiconductor device may be part of a memory system for storing data under the control of a host device such as a computer or a smartphone. The memory system may include a memory device in which data is stored and a memory controller for controlling the memory device. A memory device may be classified as a volatile memory device or a nonvolatile memory device.

A nonvolatile memory device is a memory device in which data does not disappear even when the supply of power is interrupted, A nonvolatile memory device may include Read Only Memory (ROM), Programmable ROM (PROM), Electrically Programmable ROM (EPROM), Electrically Erasable ROM (EEROM), flash memory, and the like.

A nonvolatile memory device performs a program operation of storing data. The program operation may be performed by increasing a voltage of each of bit and source lines to a target voltage and applying a program voltage to word lines. When the number of bit lines of which voltage is to be increased to the target voltage is large or when the magnitude of the target voltage to which the voltage of the source line is to be increased is large, a large current is simultaneously generated inside the nonvolatile memory device, and therefore, the time for which the voltage of each of the bit and source lines is increased to the target voltage may be adjusted to adjust an amount of current generated.

SUMMARY

Some embodiments provide a memory device and an operating method of the memory device, which can adjust the magnitude of current generated in a program operation.

In accordance with an embodiment of the present disclosure, a memory device includes: a precharge time information storage configured to store information on a first precharge time for which a bit line control signal is applied and a second precharge time for which a source line control signal is applied, which are determined according to a degree to which a program operation is performed; and a precharge voltage controller configured to provide the bit line control signal and the source line control signal respectively to page buffers and a source line driver for a longer precharge time selected from the first precharge time and the second precharge time in the program operation.

In accordance with another embodiment of the present disclosure, a memory device includes: a precharge time information storage configured to store information on a first precharge time for which a voltage of bit lines increases to a first precharge voltage and a second precharge time for which a voltage of a source line increases to a second precharge voltage, which are determined according to a degree to which a program operation is performed; and a program operation controller configured to control the program operation such that the voltage of the bit lines and the voltage of the source line respectively increase to a first precharge voltage and a second precharge voltage for any one precharge to time selected from the first precharge time and the second precharge time in the program operation.

In accordance with the present disclosure, a method of operating a memory device includes: storing information on a first precharge time for which a voltage of bit lines increases to a first precharge voltage and a second precharge time for which a voltage of a source line increases to a second precharge voltage, which are determined according to a degree to which a program operation is performed; increasing the voltage of the bit lines and the voltage of the source line respectively to a first precharge voltage and a second precharge voltage for any one precharge time selected from the first precharge time and the second precharge time; and applying a program voltage to a word line connected to memory cells.

BRIEF DESCRIPTION OF THE DRAWINGS

Example embodiments will now be described more fully hereinafter with reference to the accompanying drawings; however, they may be embodied in different forms and should not be construed as limited to the embodiments set forth herein. Rather, these embodiments are provided so that this disclosure will be enabling to those skilled in the art.

In the drawing figures, dimensions may be exaggerated for clarity of illustration. It will be understood that when an element is referred to as being "between" two elements, it can be the only element between the two dements, or one or more intervening dements may also be present. Like reference numerals refer to like elements throughout.

DETAILED DESCRIPTION

The specific structural and functional descriptions disclosed herein are merely illustrative for the purpose of describing possible embodiments according to the concept of the present disclosure. Embodiments according to the concept of the present disclosure can be implemented in various forms and should not be construed as being limited to the specific embodiments set forth herein.

Figure 1:
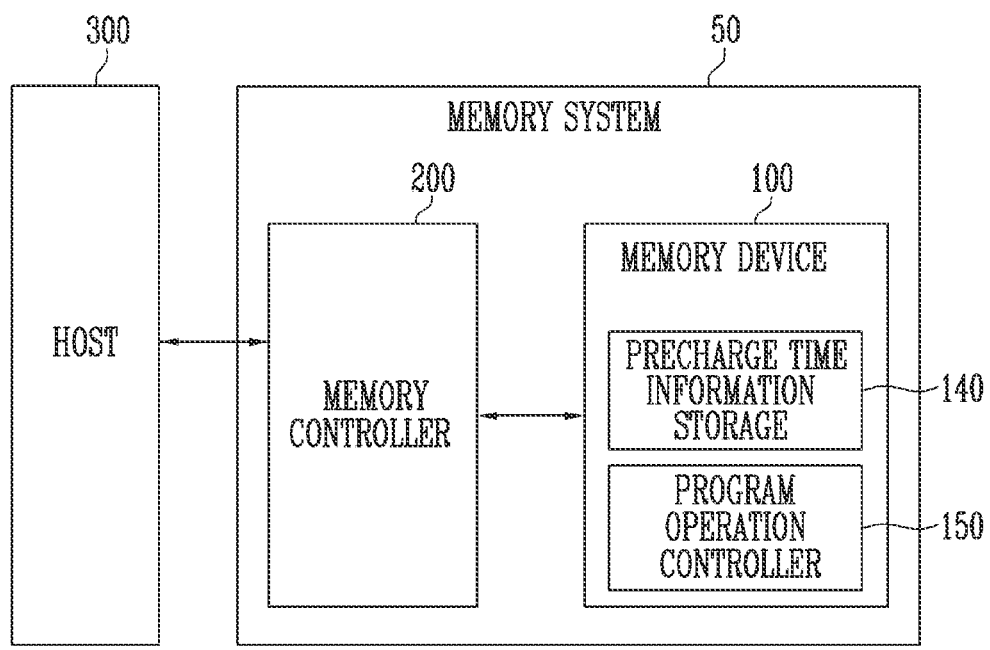
FIG. 1 is a diagram illustrating a memory system including a memory device in accordance with an embodiment of the present disclosure.

FIG. 1 is a diagram illustrating a memory system 50 including a memory device in accordance with an embodiment of the present disclosure.

Referring to FIG. 1, the memory system 50 may include a memory device 100 and a memory controller 200. The memory system 50 may be a device for storing data under the control of a host 300, such as a mobile phone, a smart phone, an MP3 player, a laptop computer, a desktop computer, a game console, a TV, a tablet PC or an in-vehicle infotainment.

The memory system 50 may be manufactured as any one of various types of storage devices according to a host interface that is a communication scheme with the host 300. For example, the memory system 50 may be configured with any one of a variety of types of storage devices, such as a Solid State Drive (SSD), a multimedia card in the form of an MMC, an eMMC, an RS-MMC and a micro-MMC, a secure digital card in the form of an SD, a mini-SD and a micro-SD, a Universal Serial Bus (USB) memory module, a Universal Flash Storage (UFS) device, a personal computer memory card international association (PCMCIA) card type memory module, a peripheral component interconnection (PCI) card type memory module, a PCI express (PCI-E) card type memory module, a Compact Flash (CF) card, a Smart Media Card (SMC), and a memory stick.

The memory system 50 may be manufactured as any one of various kinds of package types. For example, the memory system 50 may be manufactured as any one of various kinds of package types such as a Package-On-Package (POP), a System-In-Package (SIP), a System-On-Chip (SOC), a Multi-Chip Package (MCP), a Chip-On-Board (COB), a Wafer-level Fabricated Package (WFP), and a Wafer-level Stack Package (WSP).

The memory device 100 may store data. The memory device 100 may be operated under the control of the memory controller 200. The memory device 100 may include a memory cell array (not shown) including a plurality of memory cells for storing data.

Each of the memory cells may be configured as any one of a Single-Level Cell (SLC) storing one data bit, a Multi-Level Cell (MLC) storing two data bits, a Triple-Level Cell (TLC) storing three data bits, and a Quadruple-Level Cell (QLC) storing four data bits.

The memory cell array (not shown) may include a plurality of memory blocks. Each memory block may include a plurality of memory cells. One memory block may include a plurality of pages. In an embodiment, the page may be a unit for storing data in the memory device 100 or reading data stored in the memory device 100. The memory block may be a unit for erasing data.

In an embodiment, the memory device 100 may use Double Data Rate Synchronous Dynamic Random Access Memory (DDR SDRAM), Low Power Double Data Rate 4 (LPDDR4) SDRAM, Graphics Double Data Rate (DDDR) SRAM, Low Power DDR (LPDDR), Rambus Dynamic Random Access Memory (RDRAM), NAND flash memory, vertical NAND flash memory, NOR flash memory, Resistive Random Access Memory (RRAM), Phase-Change Random Access Memory (PRAM), Magnetoresistive Random Access Memory (MRAM), Ferroelectric Random Access Memory (FRAM), Spin Transfer Torque Random Access Memory (STT-RAM), or the like. In this specification, for convenience of description, a case where the memory device 100 uses NAND flash memory is assumed and described.

The memory device 100 may receive a command and an address from the memory controller 200, and access an area selected by the address in the memory cell array. The memory device 100 may perform an operation indicated by the command on the area selected by the address. For example, the memory device 100 may perform a write operation (program operation), a read operation, and an erase operation. In the write operation, the memory device 100 may program data in the area selected by the address. In the read operation, the memory device 100 may read data from the area selected by the address. In the erase operation, the memory device 100 may erase data stored in the area selected by the address.

In an embodiment, the memory device 100 may include a precharge time information storage 140 and a program operation controller 150.

The precharge time information storage 140 may store information on a time for which a precharge voltage is applied to a bit line and a source line in a precharge operation. The precharge operation may be an operation included in a program operation. The precharge operation may be an operation of increasing a voltage of the bit line and increasing a voltage of the source line. The precharge time information storage 140 may store information on a time for which the precharge voltage is applied to the bit line and a time for which the precharge voltage is applied to the source line, which are determined according to a degree to which the program operation is performed. In an embodiment, the degree to which the program operation is performed may be a number of times a plurality of program loops are performed. In another embodiment, the degree to which the program operation is performed may be a number of memory cells programmed such that the memory cells have a threshold voltage corresponding to a target program state.

The program operation controller 150 may control a program operation on memory cells. The program operation may be an operation of storing data in the memory cells. Specifically, the program operation may be an operation of increasing a threshold voltage of the memory cells according to data to be stored in the memory cells. When the program operation is performed, the memory cells may have a threshold voltage corresponding to any one state among a plurality of program states. The plurality of program states may be determined according to a number of data bits which one memory cell stores. For example, when one memory cell is programmed as a Triple-Level Cell (TLC) storing data of three bits, the plurality of program states may mean an erase state and first to seventh program states. The threshold voltage which the memory cells have after the program operation is performed may be determined according to data to be stored in the memory cells. The memory cells may have any one state among the plurality of program states as the target program state according to data to be stored therein.

In an embodiment, the program operation may include a plurality of program loops. Each program loop may include a program voltage applying operation and a verify operation. The program voltage applying operation may be an operation of increasing a threshold voltage of memory cells by using a program voltage. The verify operation may be an operation of identifying whether the threshold voltages of the memory cells has reach a threshold voltage corresponding to the target program state by using a verify voltage.

The memory controller 200 may control overall operations of the memory system 50.

When power is applied to the memory system 50, the memory controller 200 may execute firmware (FW). In an embodiment, the memory controller 200 may control communication between the host 300 and the memory device 100 by executing the FW. In an embodiment, the memory controller 200 may translate a logical block address of the host 300 into a physical block address of the memory device 100.

The memory controller 200 may control the memory device 100 to perform a write operation, a read operation, an erase operation, or the like in response to a request from the host 300. In the write operation, the memory controller 200 may provide a write command, a physical block address, and data to the memory device 100. In the read operation, the memory controller 200 may provide a read command and a physical block address to the memory device 100. In the erase operation, the memory controller 200 may provide an erase command and a physical block address to the memory device 100.

In an embodiment, the memory controller 200 may autonomously generate a command, an address, and data regardless of any request from the host 300, and transmit the command, the address, and the data to the memory device 100. For example, the memory controller 200 may provide the memory device 100 with a command, an address, and data, which are used to perform read and write operations accompanied in performing wear leveling, read reclaim, garbage collection, and the like.

In an embodiment, the memory controller 200 may control at least two memory devices 100. The memory controller 200 may control the memory devices according to an interleaving scheme to improve operational performance. The interleaving scheme may be a scheme for controlling operations on at least two memory devices 100 to overlap with each other.

The host 300 may communicate with the memory system 50, using at least one of various communication manners, such as a Universal Serial bus (USB), a Serial AT Attachment (SATA), a High Speed InterChip (HSIC), a Small Computer System Interface (SCSI), Firewire, a Peripheral Component Interconnection (PCI), a PCI express (PCIe), a Non-Volatile Memory express (NVMe), a universal flash storage (UFS), a Secure Digital (SD) Card, a Multi-Media Card (MMC), an embedded MMC (eMMC), a Dual In-line Memory Module (DIMM), a Registered DIMM (RDIMM), and a Load Reduced DIMM (LRDIMM).

In an embodiment, the memory system 50 may include a buffer memory (not shown). For example, the buffer memory may temporarily store data received from the host 300 or data received from the memory device 100, or temporarily store meta data (e.g., a mapping table) of the memory device 100. The buffer memory may include volatile memory such as DRAM, SDRAM, DDR SDRAM, LPDDR SDRAM, and GRAM or nonvolatile memory such as FRAM, ReRAM, STT-MRAM, and PRAM.

Figure 2:
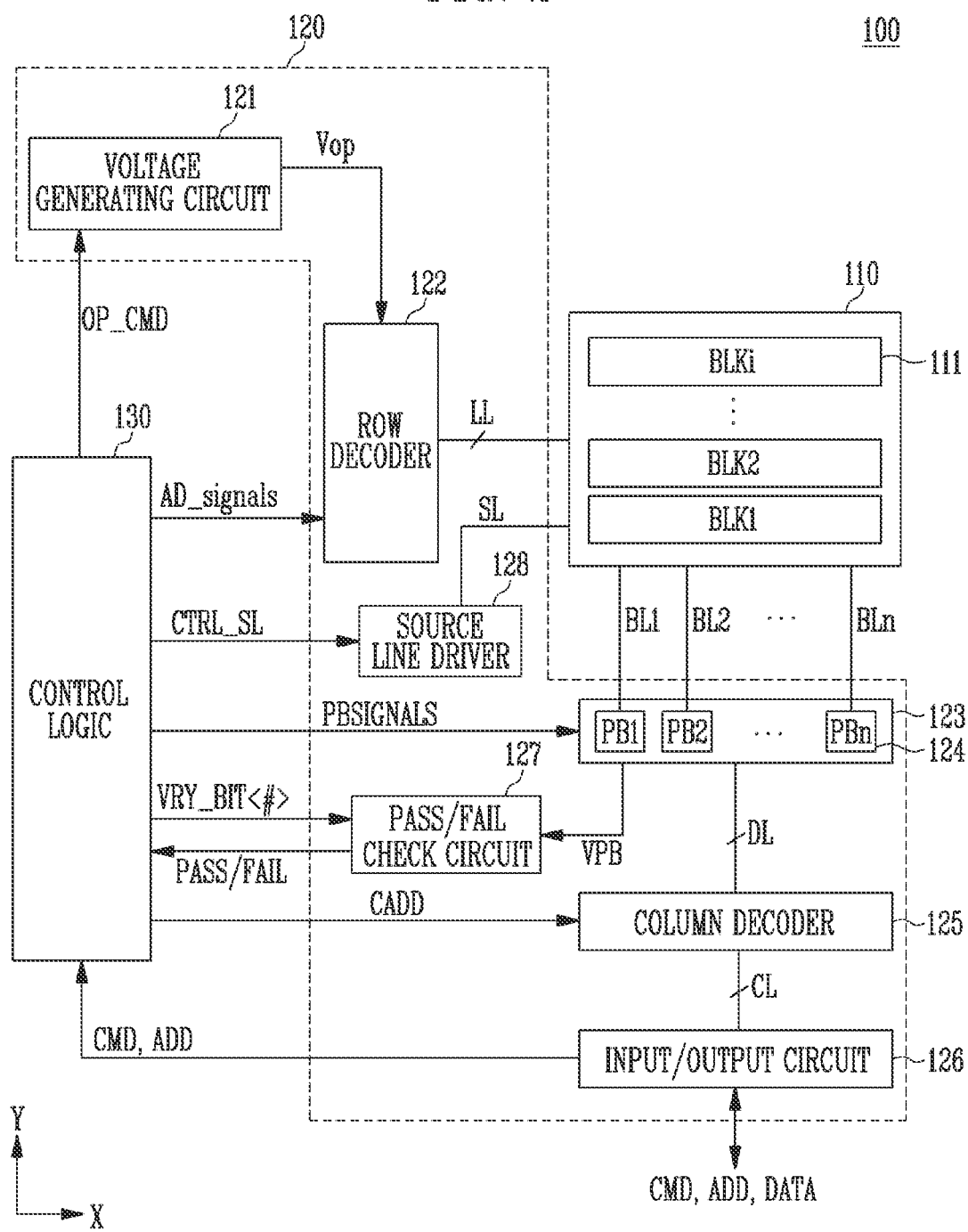
FIG. 2 is a diagram illustrating a structure of the memory device shown in FIG. 1.

FIG. 2 is a diagram illustrating a structure of the memory device shown in FIG. 1.

Referring to FIG. 2, the memory device 100 may include a memory cell array 110, a peripheral circuit 120, and control logic 130.

The memory cell array 110 includes a plurality of memory blocks BLK1 to BLKi. The plurality of memory blocks BLK1 to BLKi are connected to a row decoder 122 through local lines LL. The plurality of memory blocks BLK1 to BLKi are connected to a page buffer group 123 through bit lines BL1 to BLn. Each of the plurality of memory blocks BLK1 to BLKi includes a plurality of memory cells. In an embodiment, the plurality of memory cells are nonvolatile memory cells. Memory cells connected to the same word line among the plurality of memory cells is defined as one page. That is, the memory cell array 110 is configured with a plurality of pages. In accordance with an embodiment of the present disclosure, each of the plurality of memory blocks BLK1 to BLKi included in the memory cell array 110 may include a plurality of dummy cells. At least one dummy memory cell may be connected in series between a drain select transistor and memory cells and between a source select transistor and the memory cells.

Each of the memory cells of the memory device 100 may be configured as any one of a Single-Level Cell (SLC) storing one data bit, a Multi-Level Cell (MLC) storing two data bits, a Triple-Level Cell (TLC) storing three data bits, and a Quadruple-Level Cell (QLC) storing four data bits.

The peripheral circuit 120 drives the memory cell array 110. For example, the peripheral circuit 120 may drive the memory cell array 110 to perform a program operation, a read operation, and an erase operation under the control of the control logic 130. In another example, the peripheral circuit 120 may apply various operating voltages to the local lines LL and the bit lines BL1 to BLn or discharge the applied voltages under the control of the control logic 130.

The peripheral circuit 120 may include a voltage generating circuit 121, the row decoder 122, the page buffer group 123, a column decoder 125, an input/output circuit 126, a pass/fail check circuit 127, and a source line driver 128. The row decoder 122 is connected to the memory cell array 110 through the local lines LL. The local lines LL may include drain select lines, word lines, and source select lines. In accordance with an embodiment of the present disclosure, the word lines may include normal word lines and dummy word lines. In accordance with an embodiment of the present disclosure, the local lines LL may further include a pipe select line.

The row decoder 122 is operated under the control of the control logic 130. The row decoder 122 receives address control signals AD_signals from the control logic 130.

The row decoder 122 decodes a row address in response to the address control signal AD_signals. The row decoder 122 may select at least one word line of a selected memory block by applying voltages provided from the voltage generating circuit 121 to at least one word line according to the decoded row address.

In a program operation, the row decoder 122 may apply a program voltage to the selected word line and apply a pass voltage having a level lower than a level of the program voltage to unselected word lines. In a program verify operation, the row decoder 122 may apply a verify voltage to a selected word line and apply a verify pass voltage having a level higher than a level of the verify voltage to unselected word lines.

In a read operation, the row decoder 122 may apply a read voltage to a selected word line and apply a read pass voltage having a level higher than a level of the read voltage to unselected word lines.

An erase operation of the memory device 100 is performed in units of memory blocks. In the erase operation, an address ADD input to the memory device 100 includes a block address. The row decoder 122 may decode the block address and may select one memory block according to the decoded block address.

The voltage generating circuit 121 generates a plurality of operating voltages Vop by using an external power voltage supplied to the memory device 100. The voltage generating circuit 121 is operated under the control of the control logic 130.

In an embodiment, the voltage generating circuit 121 may generate an internal power voltage by regulating the external power voltage. The internal power voltage generated by the voltage generating circuit 121 is used as an operating voltage of the memory device 100.

In an embodiment, the voltage generating circuit 121 may generate various operating voltages Vop used for program, read, and erase operations in response to an operation signal OP_CMD. The voltage generating circuit 121 may generate a plurality of operating voltages Vop by using the external power voltage and the internal power voltage. The voltage generating circuit 121 may be configured to generate various voltages required in the memory device 100. For example, the voltage generating circuit 121 may generate a plurality of erase voltages, a plurality of program voltages, a plurality of pass voltages, a plurality of select read voltages, and a plurality of unselect read voltages.

The voltage generating circuit 121 may include a plurality of pumping capacitors for receiving the internal power voltage to generate a plurality of operating voltages Vop having various voltage levels, and selectively activate the plurality of pumping capacitors under the control of the control logic 130, thereby generating the plurality of operating voltages Vop.

The generated plurality of operating voltages Vop may be supplied to the memory cell array 110 by the row decoder 122.

The page buffer group 123 may include a first to nth page buffers PB1 to PBn. The first to nth page buffers PB1 to PBn are connected to the memory cell array 110 respectively through first to nth bit lines BL1 to BLn. The first to nth page buffers PB1 to PBn are operated under the control of the control logic 130.

The first to nth page buffers PB1 to PBn communicate data DATA with the column decoder 125. In programming, the first to nth page buffers PB1 to PBn receive data DATA to be stored through the column decoder 125 and data lines DL.

In a program operation, when a program puke is applied to a selected word line, the first to nth page buffers PB1 to PBn may transfer the data DATA received through the column decoder 125, which is to be stored, to memory cells of a selected page through the bit lines BL1 to BLn. The memory cells of the selected page are programmed according to the transferred data DATA. A memory cell connected to a bit line to which a program allow voltage (e.g., a ground voltage) is applied may have an increased threshold voltage. A threshold voltage of a memory cell connected to a bit line to which a program inhibit voltage (e.g., a power voltage) is applied may be maintained. In a program verify operation, the first to nth page buffers PB1 to PBn read data DATA stored in the selected memory cells through the bit lines BL1 to BLn from the selected memory cells.

In a read operation, the page buffer group 123 may read data DATA from memory cells of a selected page through the bit lines BL and may store the read data DATA in the first to nth page buffers PB1 to PBn.

In an erase operation, the page buffer group 123 may float the bit lines BL.

In an embodiment, while data stored in some page buffers among the plurality of page buffers included in the page buffer group 123 is programmed in the memory cell array 110, other page buffers may receive and store new data input from the memory controller (200 shown in FIG. 1).

The column decoder 125 may transfer data between the input/output circuit 126 and the page buffer group 123 in response to a column address CADD. For example, the column decoder 125 may exchange data with the page buffer group 123 through the data lines DL, or exchange data with the input/output circuit 126 through column lines CL.

The input/output circuit 126 may transfer a command CMD and an address ADD, which are transferred from the memory controller (200 shown in FIG. 1) to the control logic 130, or exchange data DATA with the column decoder 125.

In a read operation or a verify operation, the pass/fail check circuit 127 may generate a reference current in response to an allow bit VRY_BIT<#> generated by the control logic 130 and may output a pass or fail signal PASS/FAIL to the control logic 130 by comparing a sensing voltage VPB received from the page buffer group 123 with a reference voltage generated by the reference current. For example, the pass/fail check circuit 127 may output the pass signal PASS to the control logic 130 when the sensing voltage VPB is higher than the reference voltage. In another example, the pass/fail check circuit 127 may output the fail signal FAIL to the control logic 130 when the sensing voltage VPB is lower than the reference voltage.

The source line driver 128 may be connected to memory cells included in the memory cell array 110 through a source line SL, and control a voltage applied to the source line SL.

The source line driver 128 may receive a source line control signal CTRL_SL from the control logic 130 and may control a source line voltage applied to the source line SL, based on the source line control signal CTRL_SL.

The control logic 130 may be connected to the voltage generating circuit 121, the row decoder 122, the page buffer group 123, the column decoder 125, and the pass/fail check circuit 127. The control logic 130 may control overall operations of the memory device 100. The control logic 130 may be operated in response to a command CMD transferred from an external device. The control logic 130 may be implemented as hardware, software, or a combination of hardware and software. For example, the control logic 130 may be a control logic circuit operating in accordance with an algorithm and/or a processor executing control logic code.

The control logic 130 may control the peripheral circuit 120 by generating several signals in response to a command CMD and an address ADD. For example, the control logic 130 may generate the operation signal OP_CMD, the address control signal AD_signals, page buffer control signals PBSIGNALS, the allow bit VRY_BIT<#>, and the source line control signal CTRL_SL in response to the command CMD and the address ADD. The control logic 130 may output the operation signal OP_CMD to the voltage generating circuit 121, output the address control signal AD_signals to the row decoder 122, output the page buffer control signals PBSIGNALS to the page buffer group 123, output the allow bit VRY_BIT<#> to the pass/fail check circuit 127, and output the source line control signal CTRL_SL to the source line driver 128. Also, the control logic 130 may determine whether a verify operation has passed or failed in response to the pass or fail signal PASS/FAIL output from the pass/fail check circuit 127.

The precharge time information storage 140 and the program operation controller 150, which are shown in FIG. 1, may be included in the control logic 130 shown in FIG. 2.

The program operation controller 150 may control the peripheral circuit 120 to perform a program operation on memory cells. The program operation controller 150 may control the peripheral circuit 120 to apply operating voltages Vop to be used for the program operation to row lines and the bit lines BL1 to BLn. The program operation controller 150 may determine a time for which the page buffer control signal PBSIGNALS is to be applied to the page buffer group 123 and a time for which the source line control signal CTRL_SL is to be applied to the source line driver 128 in a precharge operation, based on information on a precharge time, which is stored in the precharge time information storage 140.

Figure 3:
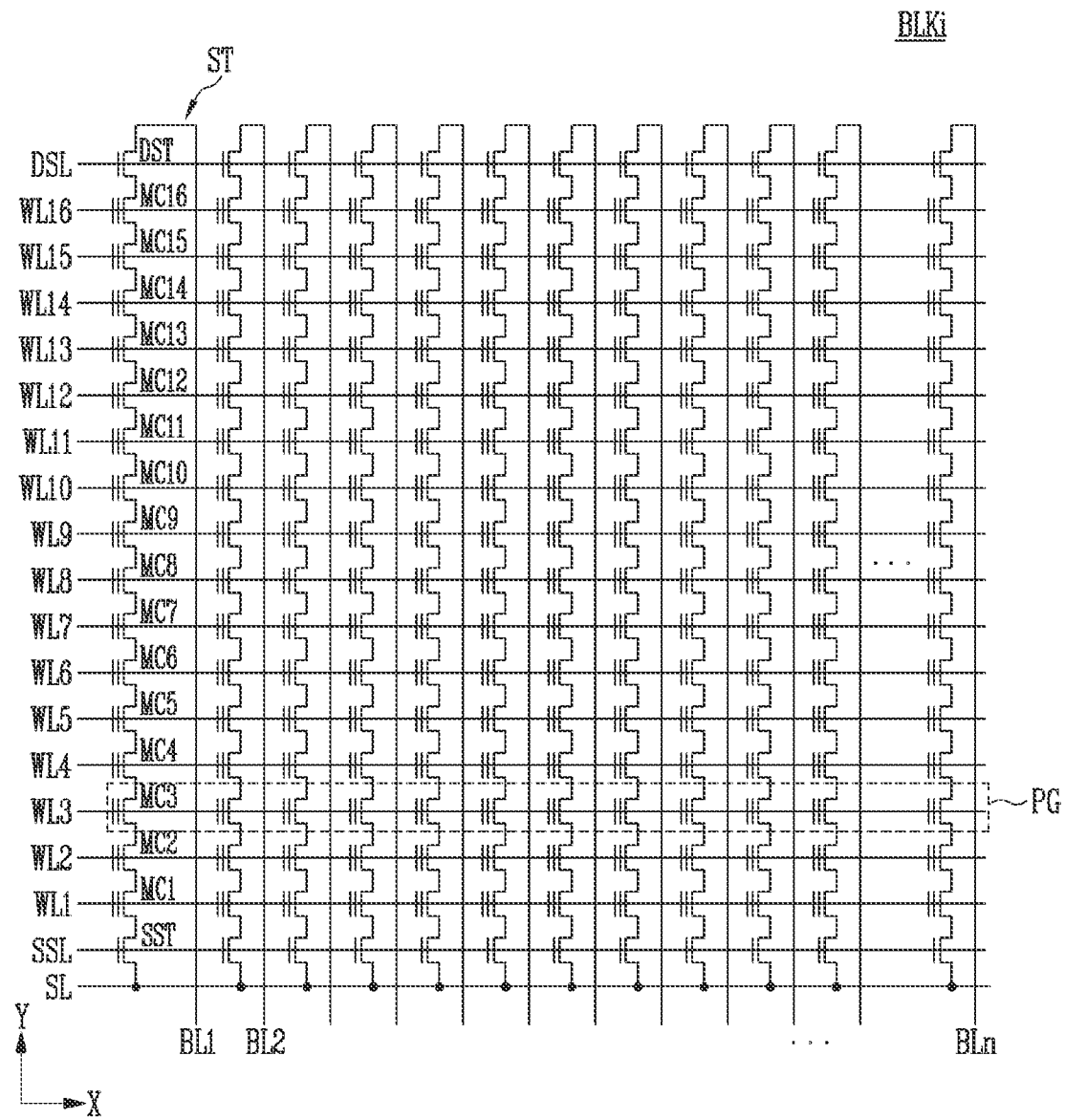
FIG. 3 is a diagram illustrating any one memory block among a plurality of memory blocks shown in FIG. 2.

FIG. 3 is a diagram illustrating any one memory block among the plurality of memory blocks BLK1 to BLKi shown in FIG. 2.

A memory block BLKi represents any one memory block among the plurality of memory blocks BLK1 to BLKi shown in FIG. 2.

Referring to FIG. 3, in the memory block BLKi, a plurality of word lines arranged in parallel to one another may be connected between a first select line and a second select line. The first select line may be a source select line SSL, and the second select line may be a drain select line DSL. More specifically, the memory block BLKi may include a plurality of strings ST connected between bit lines BL1 to BLn and a source line SL. The bit lines BL1 to BLn may be respectively connected to the strings ST, and the source line SL may be commonly connected to the strings ST. The strings ST may be configured identically to one another, and therefore, a string ST connected to a first bit line BL1 will be described in detail as an example.

The string ST may include a source select transistor SST, a plurality of memory cells MC1 to MC16, and a drain select transistor DST, which are connected in series to each other between the source line SL and the first bit line BL1. At least one source select transistor SST and at least one drain select transistor DST may be included in one string ST, and memory cells of which number is greater than the number of the memory cells MC1 to MC16 shown in the drawing may be included in the one string ST.

A source of the source select transistor SST nay be connected to the source line SL, and a drain of the drain select transistor DST may be connected to the first bit line BL1. The memory cells MC1 to MC16 may be connected in series between the source select transistor SST and the drain select transistor DST. Gates of source select transistors SST included in different strings ST may be connected to the source select line SSL, gates of drain select transistors DST included in different strings ST may be connected to the drain select line DSL, and gates of memory cells MC1 to MC16 included in different strings ST may be connected to a plurality of word lines WL1 to WL16. A group of memory cells connected to the same word line among memory cells included in different strings ST may be referred as a physical page PG. Therefore, physical pages PG of which number corresponds to the number of the word lines WL1 to WL16 may be included in the memory block BLKi.

One memory cell may store one bit. The one memory cell is generally referred to as a Single-Level cell (SLC). One physical page PG may store one logical page (LPG) data. The one LPG data may include data bits of which number corresponds to the number of cells in one physical page PG.

One memory cell may store data of two or more bits. One physical page PG may store two or more LPG data.

Figure 4:
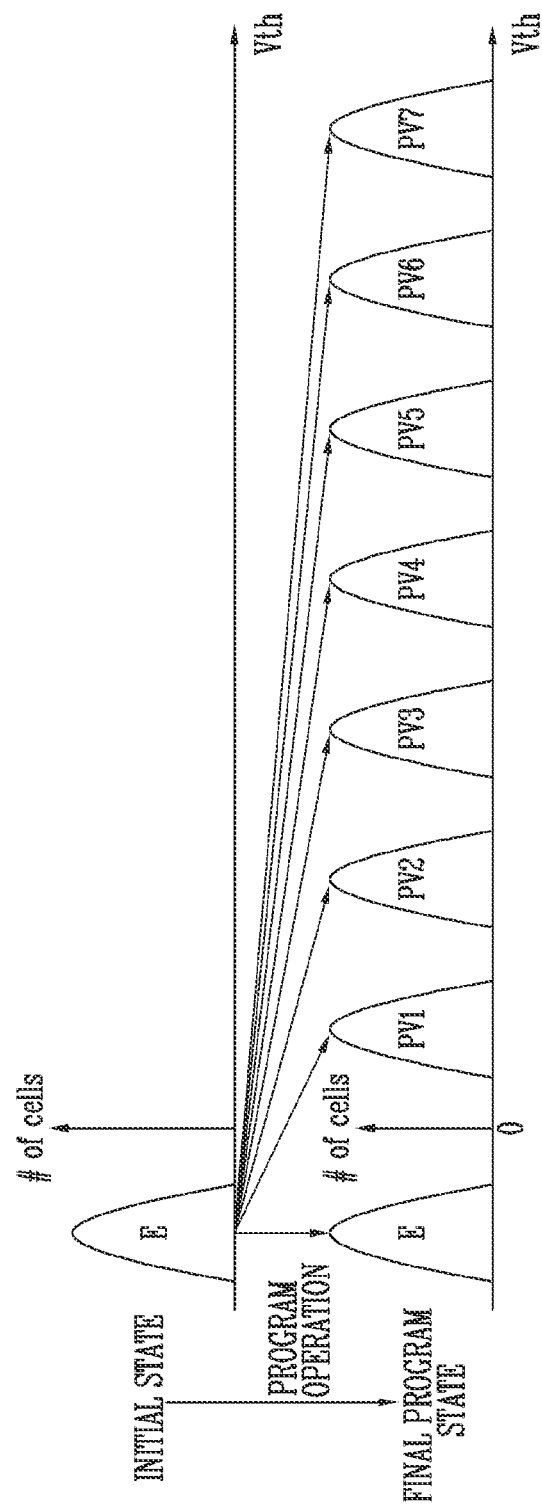
FIG. 4 is a diagram illustrating a threshold voltage distribution of memory cells according to a program operation of the memory device.

FIG. 4 is a diagram illustrating a threshold voltage distribution of memory cells according to a program operation of the memory device.

In FIG. 4, the horizontal axis of a graph represents a threshold voltage Vth of memory cells, and the vertical axis of the graph represents a number of memory cells (# of cells).

Referring to FIG. 4, a threshold voltage distribution of memory cells may be changed from an initial state to a final program state according to a program operation.

In FIG. 4, a case where one memory cell is programmed as a TLC storing data of three bits is assumed and described.

The initial state is a state in which the program operation is not performed, and the threshold voltage distribution of memory cells may be an erase state E.

The final program state may be a threshold voltage distribution of memory cells on which the program operation is performed. The threshold voltage of the memory cells on which the program operation is performed may have a threshold voltage corresponding to any one state among a plurality of program states. For example, when one memory cell is programmed as a TLC storing three-bit data, the plurality of program states may mean the erase state E and first to seventh program states PV1 to PV7. In an embodiment, the threshold voltage of the memory cells on which the program operation is performed may have a threshold voltage corresponding to any one state among the erase state E and the first to seventh program states PV1 to PV7. The threshold voltage of memory cells in the initial state may be increased to a threshold voltage corresponding to any one state among the erase state E and the first to seventh program states PV1 to PV7 through the program operation.

Each of the memory cells may have, as a target program state, any one state among the erase state E and the first to seventh program states PV1 to PV7. The target program state may be determined according to data to be stored in a memory cell. Each of the memory cells may have a threshold voltage corresponding to the final program state in the final program state through the program operation.

Figure 5:
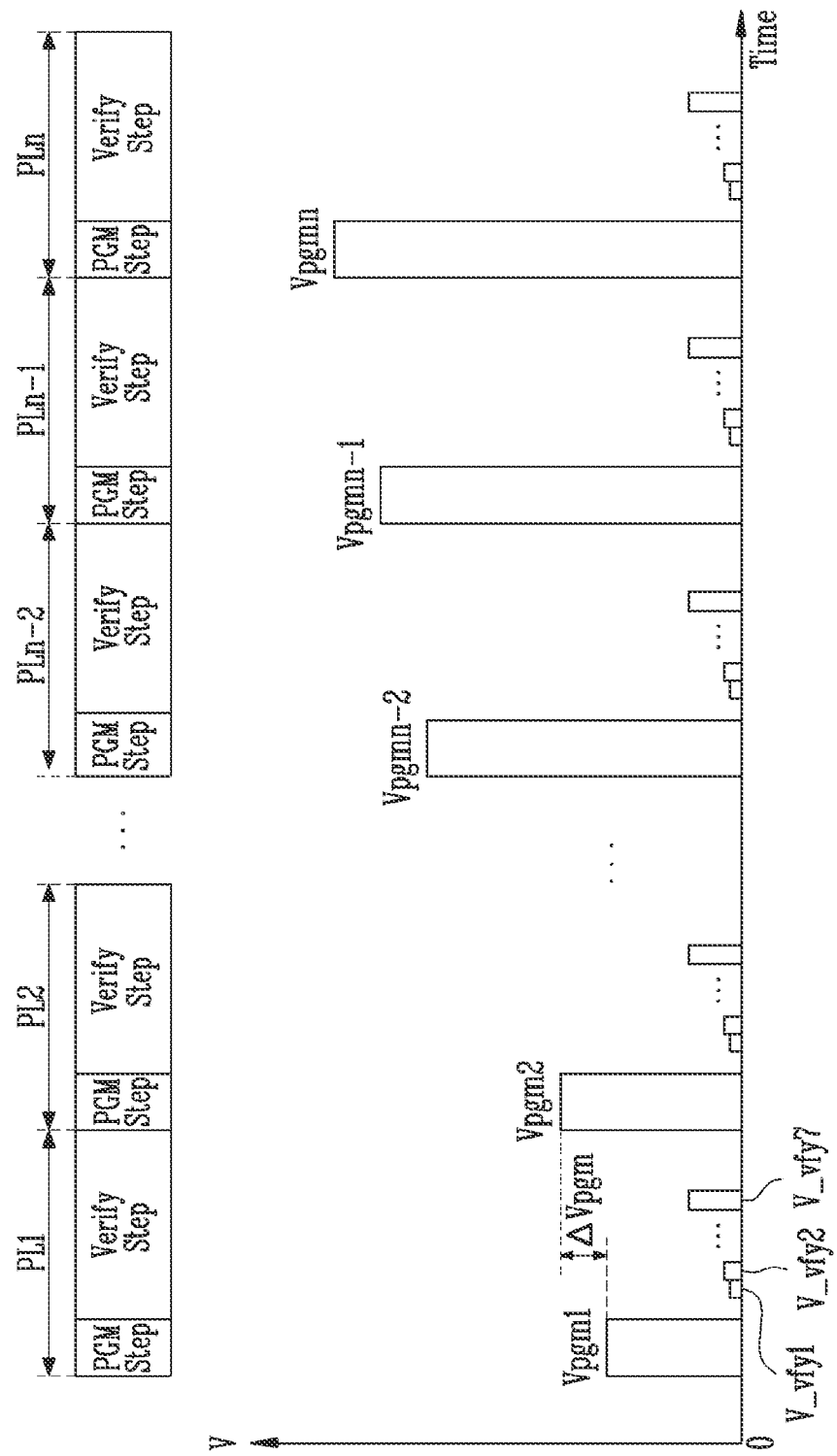
FIG. 5 is a diagram illustrating the program operation of the memory device.

FIG. 5 is a diagram illustrating the program operation of the memory device.

In FIG. 5, the horizontal axis of a graph represents a time Time, and the vertical axis of the graph represents a voltage V applied to a word line. The voltage V applied to the word line may include a program voltage Vpgm and a verify voltage V_vfy.

In FIG. 5, a case where one memory cell is programmed as a TLC storing data of three bits is assumed and described. However, the scope of the present disclosure is not limited thereto, and one memory cell may be programmed to store data of two bits or less or to store data of fourth bits or more.

Referring to FIGS. 1 and 5, the program operation of the memory device 100 may include a plurality of program loops PL1 to PLn. The memory device 100 may perform the program operation such that selected memory cells connected to a selected word line have a threshold voltage corresponding to any one state among a plurality of program states by performing the plurality of program loops PL1 to PLn. For example, when one memory cell is programmed as a TLC, the memory device 100 may perform the program operation such that the selected memory cells connected to the selected word line have a threshold voltage corresponding to any one state among an erase state E and first to seventh program states PV1 to PV7 by performing the plurality of program loops PL1 to PLn.

Each of the plurality of program loops PL1 to PLn may include a program voltage applying operation PGM Step and a verify operation Verify Step.

The program voltage applying operation PGM Step may be an operation of applying a program voltage to a selected word line to which selected memory cells are connected. For example, the memory device 100 may apply a first program voltage Vpgm1 to the selected line to which the selected memory cells are connected. After the first program voltage Vpgm1 is applied to the selected word line, a threshold voltage of each of the selected memory cells may have a threshold voltage corresponding to a target program state among a plurality of program states.

The verify operation Verify Step may be an operation of applying a verify voltage to the selected word line to which the selected memory cells are connected. The verify operation Verify Step may be an operation of determining whether a threshold voltage of each of the selected memory cells has the threshold voltage corresponding to the target program state among the plurality of program states. The verify operation Verify Step may be an operation of applying a verify voltage corresponding to the target program state of each of the selected memory cells.

In an embodiment, in the first program loop PL1, the memory device 100 may apply the first program voltage Vpgm1 to the selected word line to which the selected memory cells are connected, and then apply first to seventh verify voltages V_vfy1 to V_vfy7. The memory device 100 may apply, to the selected word line, a verify voltage corresponding to a target program state of memory cells among the first to seventh verify voltages V_vfy1 to V_vfy7. For example, the memory device 100 may perform a verify operation Verify Step on memory cells of which target program state is the first program state by using the first verify voltage V_vfy1. As the verify voltages V_vfy1 to V_vfy7 approaches from the first verify voltage V_vfy1 to the seventh verify voltage V_vfy7, the magnitudes of the verify voltages V_vfy1 to V_vfy7 may increase. Specifically, in the magnitudes of the verify voltages V_vfy1 to V_vfy7, the magnitude of the first verify voltage V_vfy1 may be smallest, and the magnitude of the seventh verify voltage V_vfy7 may be largest. The number of verify voltages is not limited to this embodiment.

It may be determined that a threshold voltage of memory cells of which verify operation Verify Step has passed by using each of the verify voltages V_vfy1 to V_vfy7 has the threshold voltage corresponding to the target program state. The memory cells of which verify operation Verify step has passed may be program-inhibited in a second program loop PL2. A program inhibit voltage may be applied to a bit line connected to the program-inhibited memory cells.

It may be determined that a threshold voltage of memory cells of which verify operation Verify Step has failed by using each of the verify voltages V_vfy1 to V_vfy7 does not have the threshold voltage corresponding to the target program state. The second program loop PL2 may be performed on the memory cells of which verify operation Verify Step has failed.

In the second program loop PL2, the memory device 100 may apply a second program voltage Vpgm2 higher by a unit voltage $\Delta$Vpgm than the first program voltage Vpgm1 to the selected word line to which the selected memory cells are connected. Subsequently, the memory device 100 may perform a verify operation Verify Step of the second program loop PL2, identically to the verify operation Verify Step of the first program loop PL1.

Subsequently, the memory device 100 may perform a next program loop by a predetermined number of times, identically to the second program loop PL2.

In an embodiment, when a program operation is not completed within a program loop performed by a predetermined number of times, the program operation may fail. When the program operation is completed within the program loop performed by the predetermined number of times, the program operation may pass. Whether the program operation has completed may be determined according to whether all verify operations Verify Step on selected memory cells have passed. When all the verify operations Verify Step on the selected memory cells pass, a next program loop might not be performed.

In an embodiment, a program voltage may be performed according to an Incremental Step Pulse Programming (ISPP) scheme. A level of the program voltage may stepwise increase or decrease as the program loops PL1 to PLn are repeated. A number of times a program voltage used in each program loop, a voltage level, a voltage application time, and the like may be determined in various ways under the control of the memory controller 200.

Figure 6:
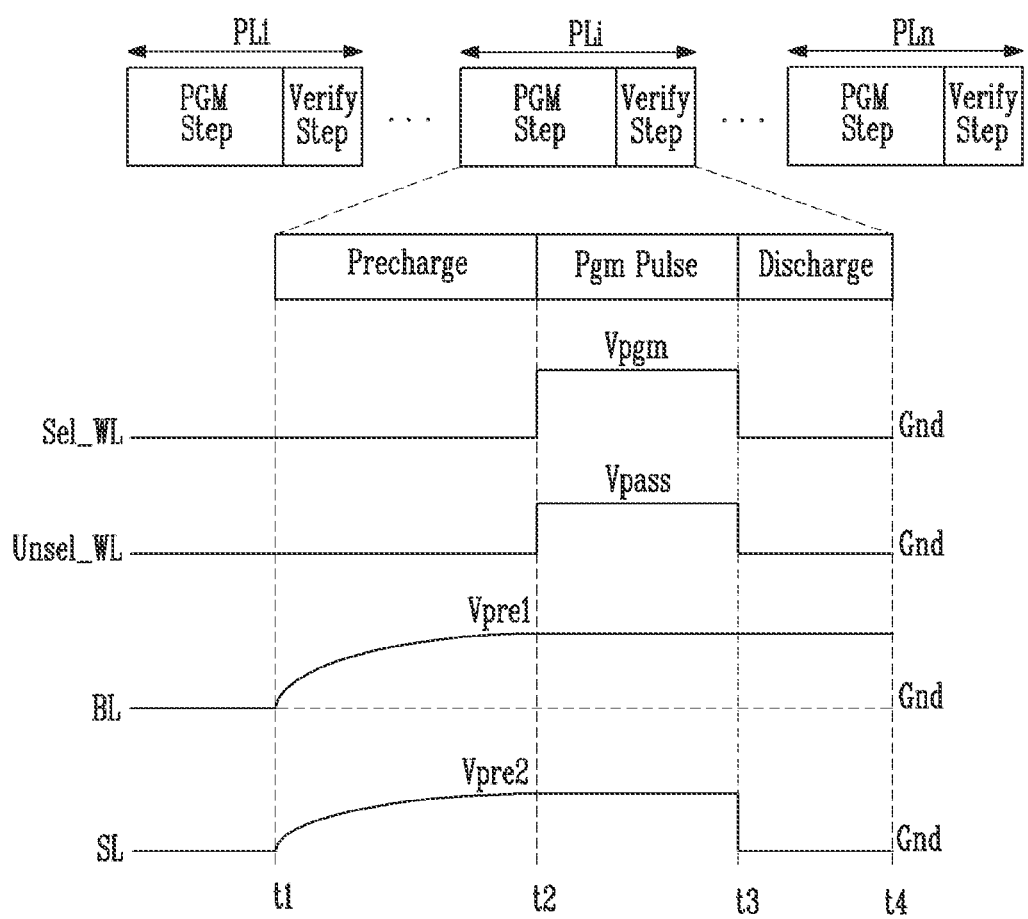
FIG. 6 is a diagram illustrating a program voltage applying operation in the program operation of the memory device.

FIG. 6 is a diagram illustrating a program voltage applying operation in the program operation of the memory device.

Referring to FIG. 6, the program operation may include a plurality of program loops PL1 to PLn. Each of the plurality of program loops PL1 to PLn may include a program voltage applying operation PGM Step and a verify operation Verify Step. The program voltage applying operation PGM Step may include a precharge period Precharge, a program pulse period Pgm Pulse, and a discharge period Discharge.

A period t1 to t2 may be the precharge period Precharge. The precharge period Precharge may be a period in which a voltage of a bit line BL and a voltage of a source line SL are precharged. A voltage of a bit line connected to a memory cell having a threshold voltage corresponding to a target program state in the precharge period Precharge may increase to a first precharge voltage Vpre1. The first precharge voltage Vpre1 may be a program inhibit voltage. In an embodiment, the first precharge voltage Vpre1 may be a voltage higher than a ground voltage Gnd. In another embodiment, the first precharge voltage Vpre1 may be a power voltage. A voltage of a bit line connected to a memory cell not having the threshold voltage corresponding to the target program state may maintain the ground voltage Gnd. The ground voltage Gnd may be a program allow voltage. The voltage of the bit line may increase to the first precharge voltage Vpre1 in response to the page buffer control signal PBSIGNALS received from the control logic 130 shown in FIG. 2.

The voltage of the source line SL in the precharge period Precharge may increase to a second precharge voltage Vpre2. When the voltage of the source line SL increases to the second precharge voltage Vpre2, a channel potential of memory cells may increase. The voltage of the source line SL may increase to the second precharge voltage Vpre2 in response to the source line control signal CTRL_SL received from the control logic 130 shown in FIG. 2. In an embodiment, a magnitude of the second precharge voltage Vpre2 may be equal to a magnitude of the first precharge voltage Vpre1. In another embodiment, the magnitude of the second precharge voltage Vpre2 may be lower than the magnitude of the first precharge voltage Vpre1.

A period t2 to t3 may the program pulse period Pgm Pulse. The program pulse period Pgm Pulse may be a period in which a threshold voltage of selected memory cells among a plurality of memory cells is increased. In the program pulse period Pgm Pulse, the memory device 100 may apply a program voltage Vpgm to a selected word line Sel_WL. In the program pulse period Pgm Pulse, the memory device 100 may apply a pass voltage Vpass to unselected word lines Unsel_WL.

A period t3 to t4 may be the discharge period Discharge. The discharge period Discharge may be a period in which voltages of the unselected word lines Unsel_WL and the source line SL are decreased. In the discharge period Discharge, the memory device 100 may apply the ground voltage Gnd to the selected word line Sel_WL. In the discharge period Discharge, the memory device 100 may apply the ground voltage Gnd to the unselected word lines Unsel_WL. The voltage of the source line SL in the discharge period Discharge may decrease to the ground voltage Gnd.

Figure 7:
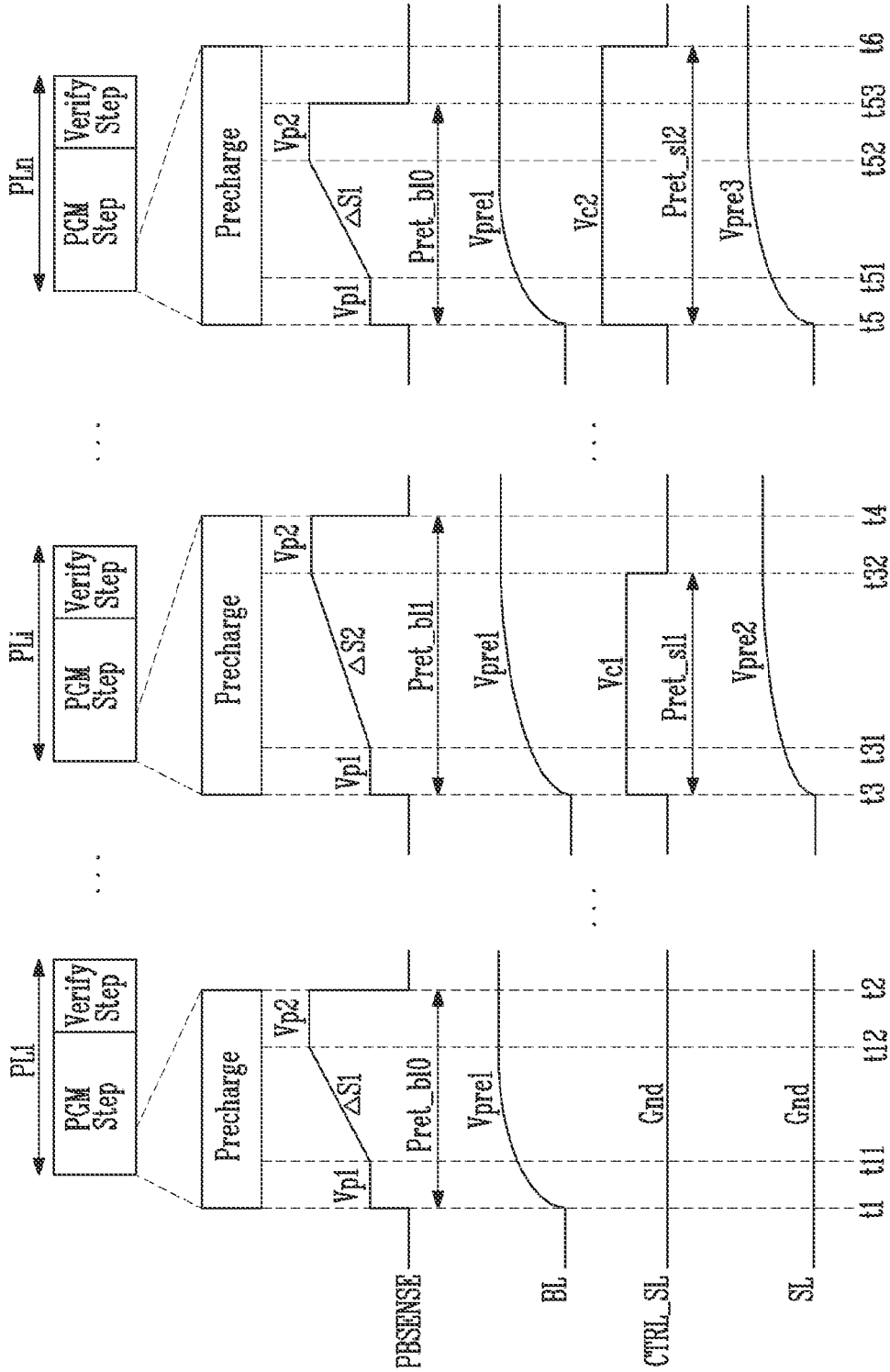
FIG. 7 is a diagram illustrating a precharge period included in the program operation in accordance with an embodiment of the present disclosure.

FIG. 7 is a diagram illustrating a precharge period included in the program operation in accordance with an embodiment of the present disclosure.

Referring to FIGS. 1 and 7, the program operation may include a plurality of program loops PL1 to PLn. Each of the plurality of program loops PL1 to PLn may include a program voltage applying operation PGM Step and a verify operation Verify Step. The program voltage applying operation PGM Step may include a precharge period Precharge, a program pulse period Pgm Pulse, and a discharge period Discharge. In FIG. 7, only the precharge period Precharge during the program voltage applying operation PGM Step will be described.

In the precharge period Precharge, the memory device 100 may apply a bit line control signal PBSENSE to a page buffer. A magnitude of the bit line control signal PBSENSE may increase with a constant slop during the precharge period Precharge. The bit line control signal PBSENSE may be a control signal for increasing a voltage of a bit line connected to the page buffer. For example, the bit line control signal PB may be a control signal included in the page buffer control signal PBSIGNALS provided from the control logic 130 shown in FIG. 2. In an embodiment, the voltage of the bit line may increase to a first precharge voltage Vpre1 in response to the bit line control signal PBSENSE.

In the precharge period Precharge, the memory device 100 may apply a source line control signal CTRL_SL to the source line driver. The source line control signal CTRL_SL may be a control signal for increasing a voltage of a source line connected to the source line driver. In an embodiment, the voltage of the source line may increase to a second precharge voltage Vpre in response to the source line control signal CTRL_SL.

A period t1 to t2 may be a precharge period of a first program loop PL1.

Specifically, in a period t1 to t11, the memory device 100 may apply, to the page buffer, the bit line control signal PBSENSE having a magnitude of a first bit line control voltage Vp1. In a period t11 to t12, the memory device 100 may increase the magnitude of the bit line control signal PBSENSE from the first bit line control voltage Vp1 to a second bit line control voltage Vp2. In the period t11 to t12, a slope with which the bit line control signal PBSENSE is increased from the first bit line control voltage Vp1 to a second bit line control voltage Vp2 may be a first slope ΔS1. In a period t12 to t2, the memory device 100 may apply, to the page buffer, the bit line control signal PBSENSE having a magnitude of the second bit line control voltage Vp2. The bit line control signal PBSENSE may be applied to the page buffer for a zeroth bit line precharge time Pret_bl0 corresponding to the period t1 to t2. In the period t1 to t2, the voltage of the bit line may increase to the first precharge voltage Vpre1.

In the period t1 to t2, the memory device 100 may not apply the source line control signal CTRL_SL to the source line driver. For example, the memory device 100 may apply the source line control signal having a magnitude of the ground voltage Gnd to the source line driver. In the period t1 to t2, the voltage of the source line may maintain the ground voltage Gnd in response to the source line control signal CTRL_SL.

A period t3 to t4 may be a precharge period of an ith program loop PLi.

Specifically, in the period t3 to t4, the memory device 100 may apply the bit line control signal PBSENSE having the first bit line control voltage Vp1 to the page buffer. In a period t31 to t32, the memory device 100 may increase the magnitude of the bit line control signal PBSENSE from the first bit line control voltage Vp1 to the second bit line control voltage Vp2. In the period t31 to t32, a slope with which the bit line control signal PBSENSE is increased from the first bit line control voltage Vp1 to a second bit line control voltage Vp2 may be a second slope ΔS2. The second slope ΔS2 may be smaller than the first slope ΔS1. In a period t32 to t4, the memory device 100 may apply the bit line control signal PBSENSE having the second bit line control voltage Vp2 to the page buffer. The bit line control signal PBSENSE may be applied to the page buffer for a first bit line precharge time Pret_bl1 corresponding to the period t3 to t4. The first bit line precharge time Pret_bl1 may be a time longer than the zeroth bit line precharge time Pret_bl0. In the period t3 to t4, the voltage of the bit line may increase to the first precharge voltage Vpre in response to the bit line control signal PBSENSE.

A program loop may exist, in which there are many memory cells of which threshold voltage increases to a threshold voltage corresponding to a target program state among the plurality of program loops in the program operation. The first precharge voltage Vpre1 is to be applied to bit lines connected to the memory cells of which threshold voltage increases to the threshold voltage corresponding to the target program state. That is, as the number of memory cells of which threshold voltage increases to the threshold voltage corresponding to the target program state becomes larger, the number of bit lines to which the first precharge voltage is to be applied becomes larger. Therefore, a large current may be simultaneously generated. Accordingly, the slope with the bit line control signal PBSENSE increases may be adjusted to adjust an amount of current generated.

In a period t3 to t32, the memory device 100 may apply, to the source line driver, the source line control signal CTRL_SL having a magnitude of a first source line control voltage Vc1. In the period t3 to t32, the voltage of the source line may increase to the second precharge voltage Vpre2 in response to the source line control signal CTRL_SL. The source line control signal CTRL_SL may be applied to the source line driver for a first source line precharge time Pret_sl1 corresponding to the period t3 to t32. The voltage of the source line may increase to the second precharge voltage Vpre2 for the first source line precharge time Pret_sl1.

In the precharge period Precharge of the ith program loop PLi, the first bit line precharge time Pret_bl1 at which the bit line control signal PBSENSE is applied and the first source line precharge time Pret_sl1 at which the source line control signal CTRL_SL is applied may be different from each other. Specifically, the first bit line precharge time Pret_bl1 may be longer than the first source line precharge time Pret_sl1. Because the precharge period Precharge of the ith program loop PLi is until a time t4 at which the application of the bit line control signal PBSENSE is ended, the source line control signal CTRL_SL may be applied until the time t4 after a time t32.

A period t5 to t6 may be a precharge period Precharge of an nth program loop PLn.

Specifically, in a period t5 to t51, the memory device 100 may apply, to the page buffer, the bit line control signal PBSENSE having the first bit line control voltage Vp1. In a period t51 to t52, the memory device 100 may increase the magnitude of the bit line control signal PBSENSE from the first bit line control voltage Vp1 to the second bit line control voltage Vp2. In the period t51 to t52, a slope with which the bit line control signal PBSENSE is increased from the first bit line control voltage Vp1 to the second bit line control voltage Vp2 may be the first slope ΔS1. In a period t52 to t53, the memory device 100 may apply, to the page buffer, the bit line control signal PBSENSE having the second bit line control voltage Vp2. The bit line control signal PBSENSE may be applied to the page buffer for a zeroth bit line precharge time Pret_bl0 corresponding to a period t5 to t53. A time for which the bit line control signal is applied in the nth program loop PLn may be shorter than the time for which the bit line control signal is applied in the ith program loop PLi. In the t5 to t53, the voltage of the bit line may increase to the first precharge voltage Vpre1 in response to the bit line control signal PBSENSE.

In the period t5 to t6, the memory device 100 may apply, to the source line driver, the source line control signal CTRL_SL having a magnitude of a second source line control voltage Vc2. The magnitude of the second source line control voltage Vc2 may be greater than the magnitude of the first source line control voltage Vc1. In the period t5 to t6, the voltage of the source line may increase to a third precharge voltage Vpre3 in response to the source line control signal CTRL_SL. A magnitude of the third precharge voltage Vpre3 may be greater than the magnitude of the second precharge voltage Vpre2. The source line control signal CTRL_SL may be applied to the source line driver for a second source line precharge time Pret_sl2 corresponding to the period t5 to t6. The voltage of the source line may increase to the third precharge voltage Vpre3 for the second source line precharge time Pret_sl2. Because a magnitude with which the voltage of the source line increases in the nth program loop PLn is greater than the magnitude with which the voltage of the source line increases in the ith program loop PLi, a source line precharge time in the nth program loop PLn may be longer than a source line precharge time in the ith program loop PLi. The second source line precharge time Pret_sl2 may be longer than the zeroth bit line precharge time Pret_bl0. The precharge period Precharge of the nth program loop PLn is until a time t6 at which the application of the source line control signal CTRL_SL is ended, and therefore, the bit line control signal PBSENSE may be applied until the time t6 after a time t53.

In an embodiment, the memory device 100 may determine a time for which the bit line control signal is applied according to a number of times a program loop is performed. In another embodiment, the memory device 100 may determine a time for which the bit line control signal is applied according to a number of memory cells having a threshold voltage corresponding to the target program state in the program operation. In still another embodiment, the memory device 100 may determine a time for which the bit line control signal is applied according to a number of bit lines to increase to the first precharge voltage Vpre1, in the program operation.

In an embodiment, the memory device 100 may determine a time for which the source line control signal is applied according to a magnitude with which the voltage of the source line increases. For example, when the magnitude with which the voltage of the source line increases is small, the time for which the source line control signal is applied may be short. In another example, when the magnitude with which the voltage of the source line increases is large, the time for which the source line control signal is applied may be long.

The memory device 100 may store information on a time for which the bit line control signal is applied and a time for which the source line control signal is applied, which are determined according to a degree to which the program operation is performed. For example, the degree to which the program operation is performed may mean a number of times a plurality of program loops are performed. In another example, the degree to which the program operation is performed may mean a number of memory cells having a threshold voltage corresponding to target program state. The memory device 100 may store the information on the time for which the bit line control signal is applied and the time for which the source line control signal is applied in the precharge time information storage 140 shown in FIG. 1. As described with reference to FIG. 7, the memory device 100 may apply the bit line control signal to the page buffer for a bit line precharge time determined according to the degree to which the program operation is performed and may apply the source line control signal to the source line driver for a source line precharge time determined according to the degree to which the program operation is performed.

The plurality of program loops PL1 to PLn may be divided into an initial period, a middle period, and an end period. For example, as shown in FIG. 7, the initial period may be the first program loop PL1, the middle period may be the ith program loop PLi, and the end period may be the nth program loop PLn. In the middle period, a bit line precharge time may be longer than a source line precharge time. In the end period, a source line precharge time may be longer than a bit line precharge time.

Figure 8:
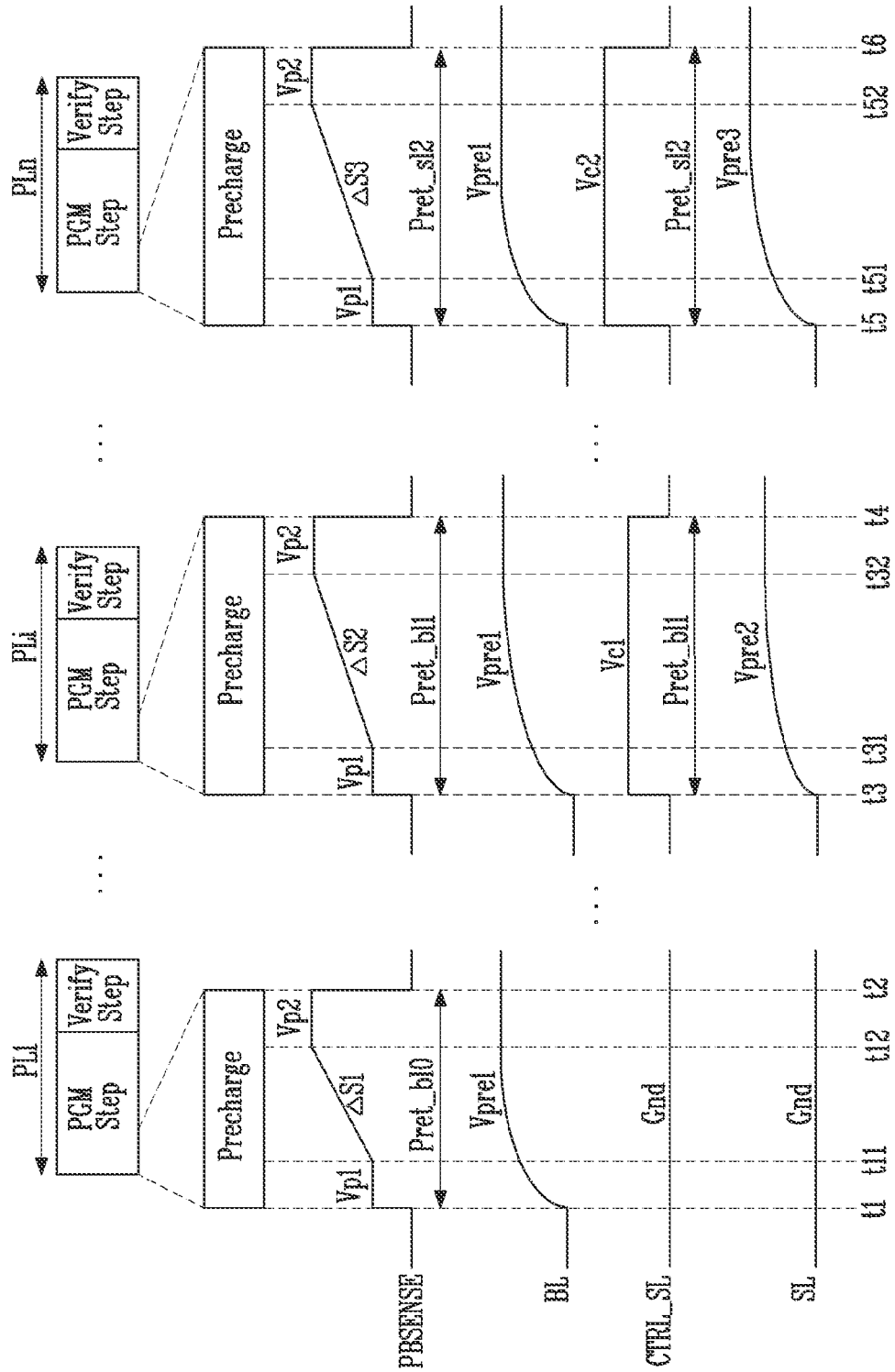
FIG. 8 is a diagram illustrating an example of a bit line and source line interlock operation in the precharge period in accordance with an embodiment of the present disclosure.

FIG. 8 is a diagram illustrating an example of a bit line and source line interlock operation in the precharge period in accordance with an embodiment of the present disclosure.

In FIG. 8, descriptions of portions overlapping with the portions shown in FIG. 71 will be omitted. In FIG. 8, only a precharge period Precharge in a program voltage applying operation PGM Step will be described.

Referring to FIGS. 1 and 8, a period t3 to t4 may be a precharge period Precharge of an ith program loop PLi.

Specifically, in the period t3 to t4, the memory device 100 may apply the bit line control signal PBSENSE to the page buffer. The bit line control signal PBSENSE may be applied to the page buffer for a first bit line precharge time Pret_bl1.

In the period t3 to t4, the memory device 100 may apply, to the source line driver, a source line control signal CTRL_SL having a first source line control voltage Vc1. The source line control signal CTRL_SL may be applied to the source line driver for the first bit line precharge time Pret_bl1 corresponding to the period t3 to t4.

In the precharge period Precharge of the ith program loop PLi, the memory device 100 may compare a bit line precharge time and a source line precharge line with each other. The memory device 100 may apply the bit line control signal PBSENSE and the source line control signal CTRL_SL respectively to the page buffer and the source line driver for a longer precharge time selected from the bit line precharge time and the source line precharge time. In an embodiment, like the ith program loop PLi shown in FIG. 7, when the bit line precharge time is longer than the source line precharge time, the memory device 100 may apply the bit line control signal PBSENSE and the source line control signal CTRL_SL respectively to the page buffer and the source line driver for the first bit line precharge time Pret_bl1 in the ith program loop PLi. The voltage of the bit line may increase to a first precharge voltage Vpre1 for the first bit line precharge time Pret_bl1. The voltage of the source line may increase to a second precharge voltage Vpre2 for the first bit line precharge time Pret_bl1.

A period t5 to t6 may be a precharge period Precharge of an nth program loop PLn.

Specifically, in the period t5 to t6, the memory device 100 may apply the bit line control signal PBSENSE to the page buffer. The bit line control signal PBSENSE may be applied for a second source line precharge time Pret_sl2 corresponding to the period t5 to t6.

In the period t5 to t6, the memory device 100 may apply, to the source line driver, the source line control signal CTRL_SL having a magnitude of a second source line control voltage Vc2. The source line control signal CTRL_SL may be applied to the source line driver for the second source line precharge time Pret_sl2 corresponding to the period t5 to t6.

In the precharge period Precharge of the nth program loop PLn, the memory device 100 may compare a bit line precharge time and a source line precharge time. In an embodiment, like the nth program loop PLn shown in FIG. 7, when the source line precharge time is longer than the bit line precharge time, the memory device 100 may apply the bit line control signal PBSENSE and the source line control signal CTRL_SL respectively to the page buffer and the source line driver for the second source line precharge time Pret_sl2 in the nth program loop PLn. The bit line control signal in the nth program loop PLn may be applied to the page buffer for the second source line precharge time Pret_Sl2 longer than the zeroth bit line precharge time Pret_bl0 described in FIG. 7. That is, a slope with which the bit line control signal PBSENSE increases in the nth program loop PLn shown in FIG. 8 may be smaller than the slope with which the bit line control signal PBSENSE increases in the nth program loop PLn shown in FIG. 7.

The voltage of the bit line may increase to the first precharge voltage Vpre for the second source line precharge time Pret_sl2. The voltage of the source line may increase to a third precharge voltage Vpre3 for the second source line precharge time Pret_sl2.

In an embodiment, the memory device 100 may compare a bit line precharge time and a source line precharge time with each other in each of a plurality of program loops. The memory device 100 may apply the bit line control signal and the source line control signal to the page buffer and the source line driver for a longer precharge time selected from the bit line precharge time and the source line precharge time in each of the plurality of program loops.

Figure 9:
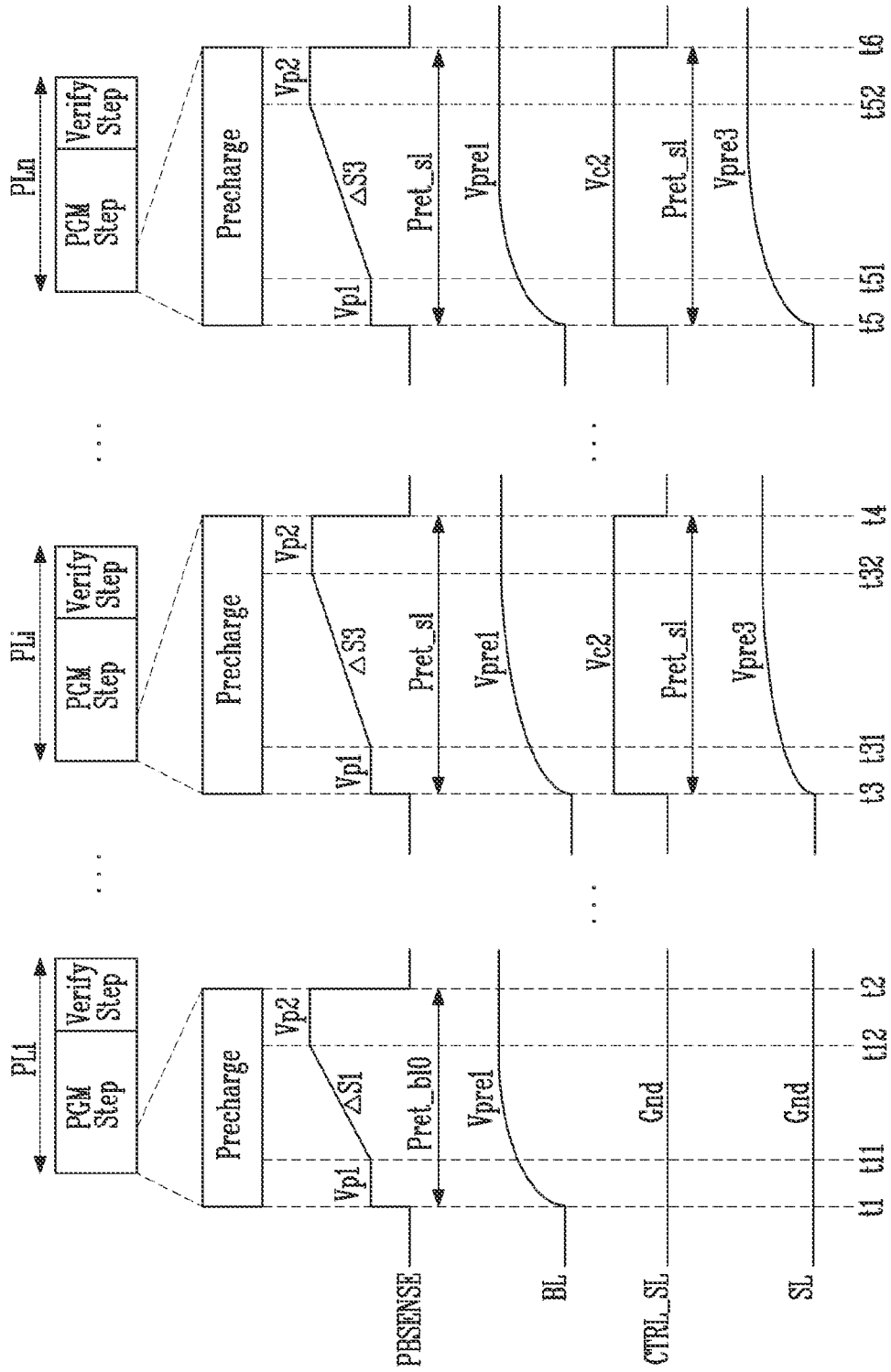
FIG. 9 is a diagram illustrating an example of the bit line and source line interlock operation in the precharge period in accordance with an embodiment of the present disclosure.

FIG. 9 is a diagram illustrating an example of the bit line and source line interlock operation in the precharge period in accordance with an embodiment of the present disclosure.

In FIG. 9, descriptions of portions overlapping with the portions shown in FIGS. 7 and 8 will be omitted. In FIG. 9, only a precharge period Precharge in a program voltage applying operation PGM Step will be described.

Referring to FIGS. 1 and 9, a period t3 to t4 may be a precharge period Precharge of an ith program loop PLi.

Specifically, in the period t3 to t4, the memory device 100 may apply the bit line control signal PBSENSE to the page buffer. The bit line control signal PBSENSE may be applied to the page buffer for a source line precharge time Pret_sl corresponding to the period t3 to t4.

In the period t3 to t4, the memory device 100 may apply, to the source line driver, the source line control signal CTRL_SL having a magnitude of a second source line control voltage Vc2. The source line control signal CTRL_SL may be applied to the source line driver for the source line precharge time Pret_sl corresponding to the period t3 to t4.

In an embodiment, unlike the case where the bit line precharge time is longer than the source line precharge time in the ith program loop PLi shown in FIG. 7, a source line precharge time may be longer than a bit line precharge time in the ith program loop PLi shown in FIG. 9. The memory device 100 may apply the bit line control signal PBSENSE and the source line control signal CTRL_SL respectively to the page buffer and the source line driver for the source line precharge time Pret_sl in the ith program loop PLi. The voltage of the bit line may increase to a first precharge voltage Vpre1 for the source line precharge time Pret_sl. The voltage of the source line may increase to a third precharge voltage Vpre3 for the source line precharge time Pret_sl.

A period t5 to t6 may be a precharge period Precharge of an nth program loop PLn.

Specifically, in the period t5 to t6, the memory device 100 may apply the bit line control signal PBSENSE to the page buffer. The bit line control signal PBSENSE may be applied to the page buffer for a source line precharge time Pret_sl corresponding to the period t5 to t6.

In the period t5 to t6, the memory device 100 may apply, to the source line driver, the source line control signal having a magnitude of a second source line control voltage Vc2. The source line control signal CTRL_SL may be applied to the source line driver for the source line precharge time Pret_sl corresponding to the period t5 to t6. The memory device 100 may apply the bit line control signal PBSENSE and the source line control signal CTRL_SL respectively to the page buffer and the source line driver for the source line precharge time Pret_sl in the nth program loop PLn. The voltage of the bit line may increase to the first precharge voltage Vpre1 for the source line precharge time Pret_sl. The voltage of the source line may increase to the third precharge voltage Vpre3 for the source line precharge time Pret_sl.

Figure 10:
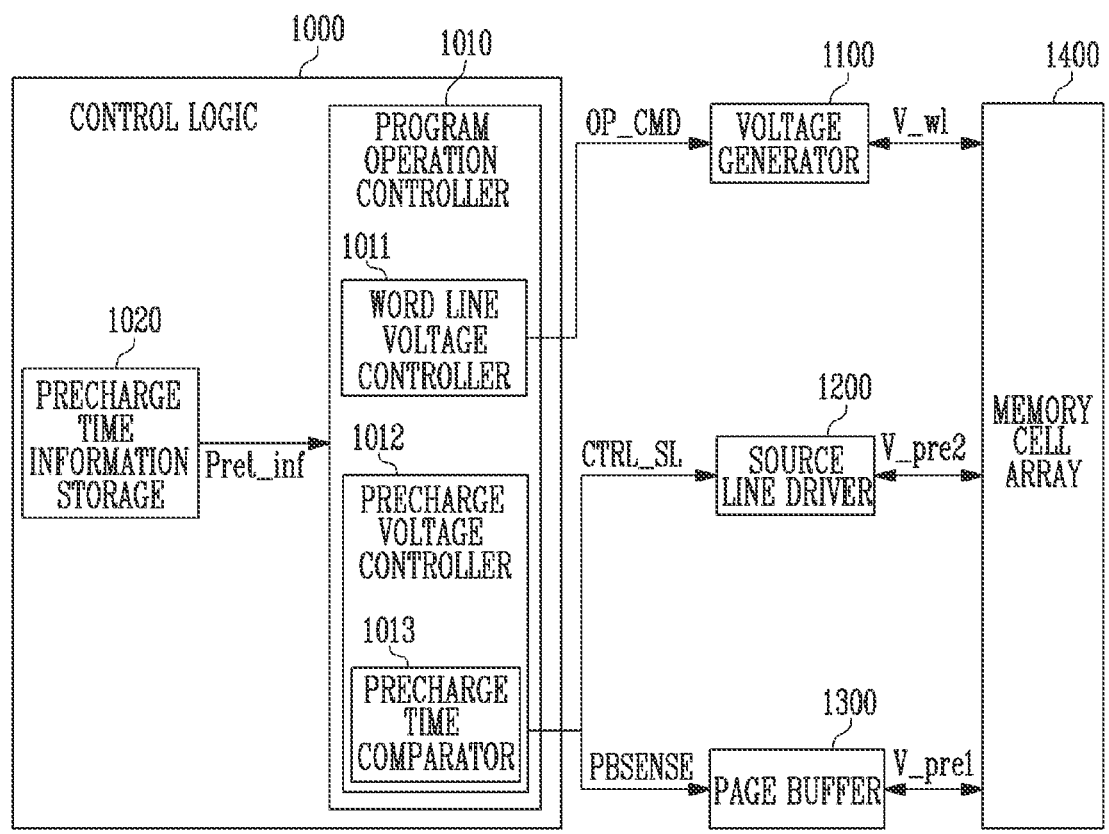
FIG. 10 is a diagram illustrating a program voltage applying operation in accordance with an embodiment of the present disclosure.

FIG. 10 is a diagram illustrating a program voltage applying operation in accordance with an embodiment of the present disclosure.

The memory device 100 shown in FIG. 1 may include control logic 1000, a voltage generator 1100, a source line driver 1200, a page buffer 1300, and a memory cell array 1400.

The control logic 1000 may be implemented as one component of the control logic 130 shown in FIG. 2. The voltage generator 1100 may include the voltage generating circuit 121 and the row decoder 122, which are shown in FIG. 2. The source line driver 1200 may be implemented as one component of the source line driver 128 shown in FIG. 2. The page buffer 1300 may be implemented as one component of the page buffer group 123 shown in FIG. 2.

The control logic 1000 may include a program operation controller 1010 and the precharge time information storage 1020. The program operation controller 1010 may control a program operation on the memory cell array 1400. The precharge time information storage 1020 may store information on a bit line precharge time and a source line precharge time, which are determined according to a degree to which the program operation is performed.

The program operation controller 1010 may include a word line voltage controller 1011 and a precharge voltage controller 1012. The word line voltage controller 1011 may control a voltage to be applied to a word line connected to memory cells. The word line voltage controller 1011 may provide the voltage generator 1100 with a word line voltage control signal OP_CMD for generating a voltage V_wl to be applied to the word line.

The precharge voltage controller 1012 may provide a source line control signal CTRL_SL and a bit line control signal PBSENSE respectively to the source line driver 1200 and the page buffer 1300, based on information Pret_inf on a precharge time, which is provided from the precharge time information storage 1020. The information Pret_inf on the precharge time may include information on a bit line precharge time and a source line precharge time.

In an embodiment, in a first precharge mode, the precharge voltage controller 1012 may provide the bit line control signal PBSENSE to the page buffer 1300 for a bit line precharge time and may provide the source line control signal CTRL_SL to the source line driver 1200 for a source line precharge time. That is, the precharge voltage controller 1012 may provide the bit line control signal PBSENSE and the source line control signal CTRL_SL respectively to the page buffer 1300 and the source line driver 1200 for the bit line precharge time and the source line precharge time, which are determined according to the degree to which the program operation is performed as described in FIG. 7.

In another embodiment, in a second precharge mode, the precharge voltage controller 1012 may provide the bit line control signal PBSENSE and the source line control signal CTRL_SL respectively to the page buffer 1300 and the source line driver 1200 for a longer precharge time selected from the hit line precharge time and the source line precharge time, which are determined according to the degree to which the program operation is performed as described in FIG. 8. The precharge voltage controller 1012 may compare a bit line precharge time and a source line precharge time with each other in each of a plurality of program loops. In an embodiment, the precharge voltage controller 1012 may include a precharge time comparator 1013 for comparing a bit line precharge time and a source line precharge time with each other in each of the plurality of program loops. The precharge time comparator 1013 may determine, as a precharge time, a longer precharge time selected from the bit line precharge time and the source line precharge time.

The voltage generator 1100 may generate a voltage V_wl to be applied to a word line in response to the word line voltage control signal OP_CMD and provide the generated voltage V_wl to the memory cell array 1400. The voltage V_wl to be applied to the word line may be a program voltage or a pass voltage.

The source line driver 1200 may provide a second precharge voltage V_pre2 to the memory cell array 1400 in response to the source line control signal CTRL_SL. A voltage of a source line connected between the source line driver 1200 and the memory cell array 1400 may increase to the second precharge voltage V_pre2 according to the source line control signal CTRL_SL.

The page buffer 1300 may provide a first precharge voltage V_pre1 to the memory cell array 1400 in response to the bit line control signal PBSENSE. A voltage of a bit line connected between the page buffer 1300 and the memory cell array 1400 may increase to the first precharge voltage V_pre1 according to the bit line control signal PBSENSE.

Figure 11:
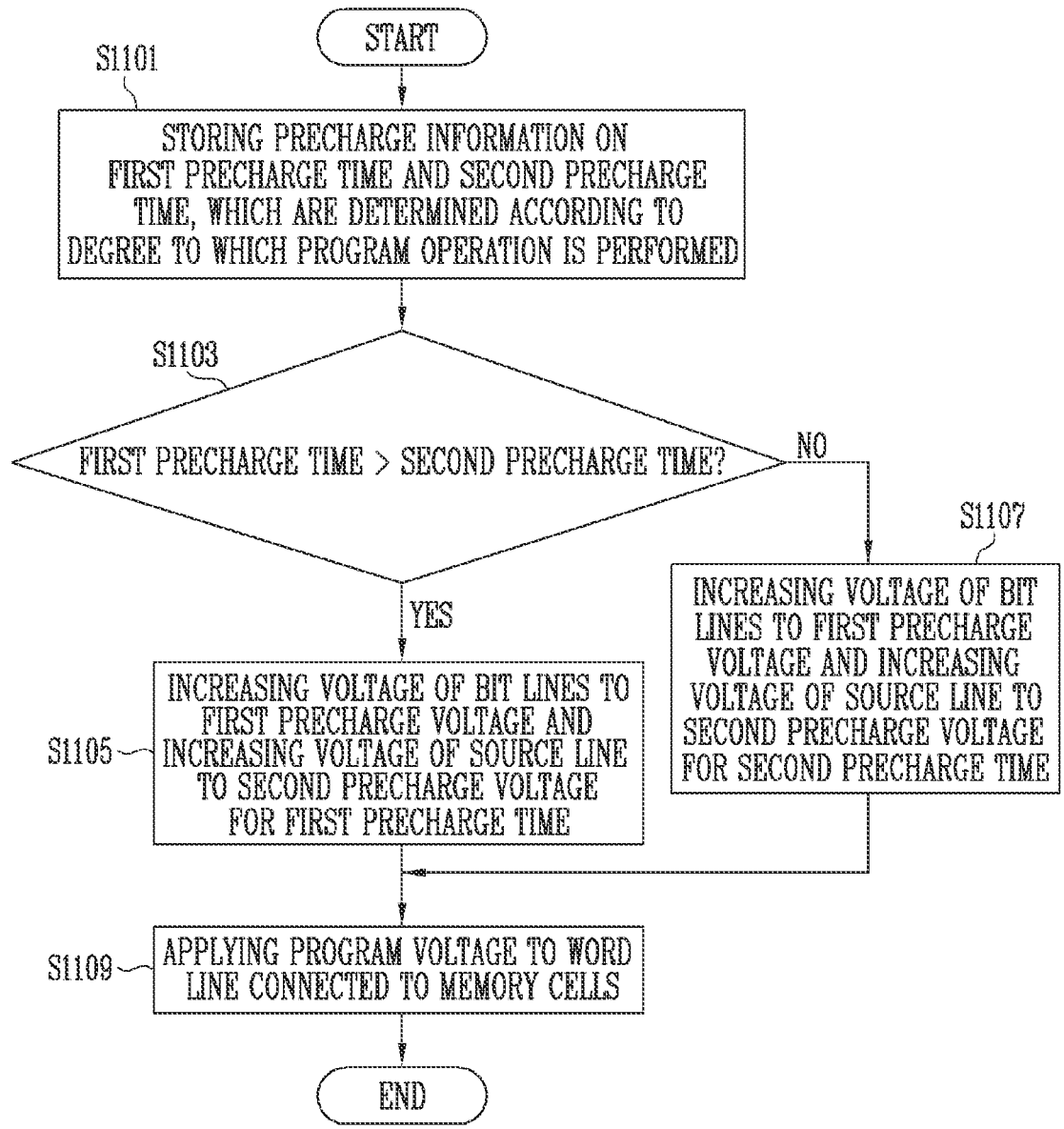
FIG. 11 is a flowchart illustrating a program operation of the memory device in accordance with an embodiment of the present disclosure.

FIG. 11 is a flowchart illustrating a program operation of the memory device in accordance with a method of the present disclosure.

Referring to FIG. 11, in step S1101, the memory device 100 may store precharge information on a first precharge time and a second precharge time, which are determined according to a degree to which the program operation is performed. The first precharge time may be a bit line precharge time. The second precharge time may be a source line precharge time.

In step S1103, the memory device 100 may compare the first precharge tune and the second precharge time with each other. When the first precharge time selected from the first precharge time and the second precharge time is longer, step S1105 may be performed. Alternatively, when the second precharge time selected from the first precharge time and the second precharge time is longer, step S1107 may be performed.

In the step S1105, the memory device 100 may increase a voltage of the bit lines to a first precharge voltage and increase a voltage of the source line to a second precharge voltage for the first precharge time. In an embodiment, the memory device 100 may apply a bit line control signal and a source line control signal respectively to the page buffer and the source line driver for the first precharge time.

In the step S1107, the memory device 100 may increase the voltage of the bit lines to the first precharge voltage and increase the voltage of the source line to the second precharge voltage for the second precharge time. In an embodiment, the memory device 100 may apply the bit line control signal and the source line control signal respectively to the page buffer and the source line driver for the second precharge time.

In step S1109, the memory device 100 may apply a program voltage to a word line connected to memory cells.

In accordance with the present disclosure, there can be provided a memory device and an operating method of the memory device, which can adjust the magnitude of current generated in a program operation.

While the present disclosure has been shown and described with reference to certain exemplary embodiments thereof, it will be understood by those skilled in the art that various changes in form and details may be made therein without departing from the spirit and scope of the present disclosure as defined by the appended claims and their equivalents. Therefore, the scope of the present disclosure should not be limited to the above-described exemplary embodiments but should be determined by not only the appended claims but also the equivalents thereof.

In the above-described embodiments, all steps may be selectively performed or part of the steps and may be omitted. In each embodiment, the steps are not necessarily performed in accordance with the described order and may be rearranged. The embodiments disclosed in this specification and drawings are only examples to facilitate an understanding of the present disclosure, and the present disclosure is not limited thereto. That is, it should be apparent to those skilled in the art that various modifications can be made on the basis of the technological scope of the present disclosure.

Meanwhile, the embodiments of the present disclosure have been described in the drawings and specification. Although specific terminologies are used here, those are only to explain the embodiments of the present disclosure. Therefore, the present disclosure is not restricted to the above-described embodiments and many variations are possible within the spirit and scope of the present disclosure. It should be apparent to those skilled in the art that various modifications can be made on the basis of the technological scope of the present disclosure in addition to the embodiments disclosed herein.

What is claimed is:

1. A memory device comprising:
   a precharge time information storage configured to store information on a first precharge time for which a bit line control signal is applied and a second precharge time for which a source line control signal is applied, which are determined according to a degree to which a program operation is performed; and
   a precharge voltage controller configured to provide the bit line control signal and the source line control signal respectively to page buffers and a source line driver for a longer precharge time selected from the first precharge time and the second precharge time in the program operation.

2. The memory device of claim 1, further comprising:
   memory cells respectively connected between a source line and bit lines; and
   a word line voltage controller configured to perform the program operation including a plurality of program loops for storing data in the memory cells,
   wherein the page buffers provide a voltage to the bit lines according to the bit line control signal, and
   wherein the source line driver provides a voltage to the source line according to the source line control signal.

3. The memory device of claim 2, wherein a magnitude of the bit line control signal increases with a constant slope for the longer precharge time.

4. The memory device of claim 3, wherein the degree to which the program operation is performed is a number of times the plurality of program loops are performed.

5. The memory device of claim 3, wherein the degree to which the program operation is performed is a number of memory cells programmed to have a threshold voltage corresponding to a target program state among the memory cells.

6. The memory device of claim 4, wherein the precharge voltage controller further includes a precharge time comparator configured to determine the longer precharge time, based on a result obtained by comparing the first precharge time and the second precharge time with each other.

7. The memory device of claim 6, wherein the plurality of program loops include an initial period, a middle period, and an end period, and
   wherein the precharge voltage controller provides the source line control signal to the source line driver in the middle period and the end period.

8. The memory device of claim 7, wherein the precharge time comparator determines the longer precharge time as the second precharge time in the middle period and the end period.

9. The memory device of claim 7, wherein a size of the source line control signal increases based on the number of times of the plurality of program loops are performed.

10. The memory device of claim 9, wherein the precharge time comparator:
    determines the longer precharge time as the first precharge time in the middle period, and
    determines the longer precharge time as the second precharge time in the end period.

* * * * *